US012289935B2

(12) United States Patent
Kawaguchi et al.

(10) Patent No.: US 12,289,935 B2
(45) Date of Patent: Apr. 29, 2025

(54) METHOD FOR MANUFACTURING LIGHT-EMITTING ELEMENT

(71) Applicant: NICHIA CORPORATION, Anan (JP)

(72) Inventors: Hirofumi Kawaguchi, Tokushima (JP); Takeshi Baba, Anan (JP); Taku Yuasa, Anan (JP); Kazuki Kumegawa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 356 days.

(21) Appl. No.: 18/061,225

(22) Filed: Dec. 2, 2022

(65) Prior Publication Data
US 2023/0187585 A1 Jun. 15, 2023

(30) Foreign Application Priority Data
Dec. 10, 2021 (JP) .................................. 2021-200902

(51) Int. Cl.
*H10H 20/84* (2025.01)
*H10H 20/01* (2025.01)

(52) U.S. Cl.
CPC .......... *H10H 20/84* (2025.01); *H10H 20/034* (2025.01)

(58) Field of Classification Search
None
See application file for complete search history.

(56) References Cited

U.S. PATENT DOCUMENTS

| 2013/0244360 | A1* | 9/2013 | Sato ................ H10H 20/01 438/29 |
| 2015/0263241 | A1* | 9/2015 | Akiyama ........... H10H 20/852 257/98 |
| 2015/0364643 | A1 | 12/2015 | Sumitomo et al. |
| 2016/0204309 | A1 | 7/2016 | Akagi et al. |
| 2017/0069681 | A1* | 3/2017 | Lee ................. H10H 20/856 |
| 2017/0133554 | A1 | 5/2017 | Okuyama |
| 2017/0294479 | A1* | 10/2017 | Cha ................. H10H 20/81 |
| 2018/0342492 | A1 | 11/2018 | Lu |
| 2018/0342691 | A1 | 11/2018 | Lu |

(Continued)

FOREIGN PATENT DOCUMENTS

| JP | 2014-183109 A | 9/2014 |
| JP | 2015-035539 A | 2/2015 |
| JP | 2016-004892 A | 1/2016 |

(Continued)

*Primary Examiner* — Khaja Ahmad
(74) *Attorney, Agent, or Firm* — Foley & Lardner LLP

(57) ABSTRACT

A method for manufacturing a light-emitting element includes: providing a structure body including: a semiconductor structure body having a first surface, a second surface located on a side opposite to the first surface, and a lateral surface that connects the first surface and the second surface, a first insulating film covering the lateral surface of the semiconductor structure body, a second insulation film covering the first surface of the semiconductor structure body and an upper surface of the first insulating film on a first surface side, and a substrate facing the second surface of the semiconductor structure body; forming a mask on a part of the second insulating film located above the first surface of the semiconductor structure body; and removing a part of the second insulating film located around the mask in a top view and exposed from the mask.

19 Claims, 17 Drawing Sheets

(56) References Cited

U.S. PATENT DOCUMENTS

2020/0266326 A1\* 8/2020 Ichikawa ........... H10D 30/0295

FOREIGN PATENT DOCUMENTS

| JP | 2016-015467 A | 1/2016 |
| JP | 2020-025064 A | 2/2020 |
| JP | 2020-521180 A | 7/2020 |
| JP | 2020-521181 A | 7/2020 |
| WO | WO-2018/214199 A1 | 11/2018 |

\* cited by examiner

METHOD FOR MANUFACTURING LIGHT-EMITTING ELEMENT

CROSS-REFERENCE TO RELATED APPLICATION

This application claims priority to Japanese Patent Application No. 2021-200902, filed on Dec. 10, 2021, the disclosure of which is hereby incorporated by reference in its entirety.

BACKGROUND

The present disclosure relates to a method for manufacturing a light-emitting element.

For example, PCT Publication No. WO2018-214199 discloses a step of forming a photoresist layer on a second insulating layer in a structure in which a first insulating layer is formed on a lateral surface of an LED semiconductor layer supported by a transfer substrate, and the second insulating layer is further formed on an upper surface of the LED semiconductor layer and an upper surface of the first insulating layer, and a step of etching the second insulating layer with the photoresist layer as a mask to form a through hole in the second insulating layer.

SUMMARY

An object of the present disclosure is to provide a method for manufacturing a light-emitting element that can reduce chipping of an insulating film that covers a semiconductor structure.

According to an aspect of the present disclosure, a method for manufacturing a light-emitting element includes: providing a semiconductor structure body including a first surface, a second surface located on a side opposite to the first surface, and a lateral surface that connects the first surface and the second surface, and a structure including a first insulating film that covers the lateral surface, a second insulating film that covers the first surface and an upper surface of the first insulating film on the first surface side, and a substrate facing the second surface; forming a mask on the second insulating film located above the first surface; and removing a part of the second insulating film located around the mask in a top view and exposed from the mask. In the removing the part of the second insulating film, the part of the second insulating film is removed such that an outer edge of the second insulating film is located in a region of the first insulating film located outside the first surface in the top view.

The present disclosure can provide a method for manufacturing a light-emitting element that can reduce chipping of an insulating film that covers a semiconductor structure.

DETAILED DESCRIPTION

Figure 1:
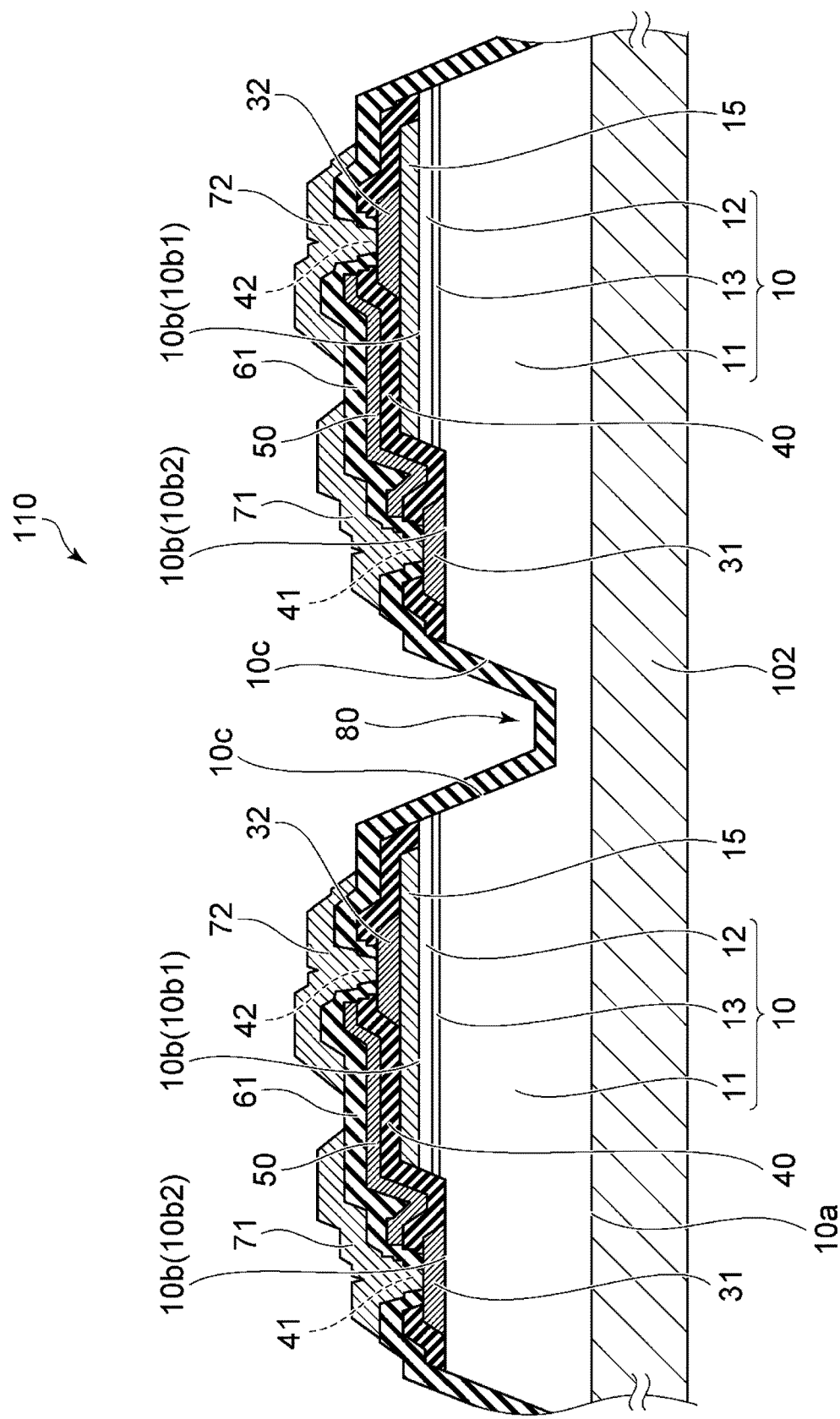
FIG. 1 is a cross-sectional view for illustrating a step of a method for manufacturing a light-emitting element according to an embodiment.

Embodiments will be described below with reference to the drawings. In the drawings, the same constituent elements are denoted using the same reference characters. Note that the drawings are diagrams that schematically illustrate embodiments, and thus scales and intervals of members, positional relationships, and the like may be exaggerated, or some of the members may not be illustrated in the drawings. As a cross-sectional view, an end surface illustrating only a cut surface may be illustrated.

Figure 7:
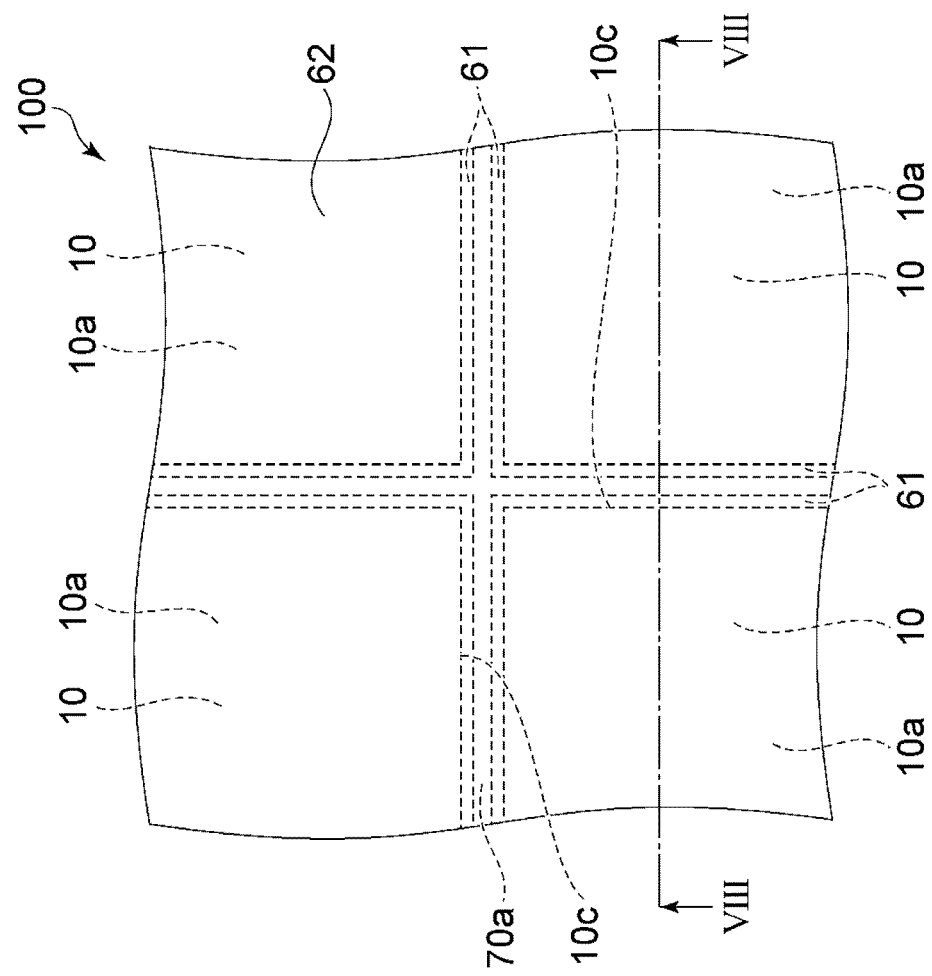
FIG. 7 is a top view for illustrating a step of the method for manufacturing the light-emitting element according to the embodiment.
Figure 8:
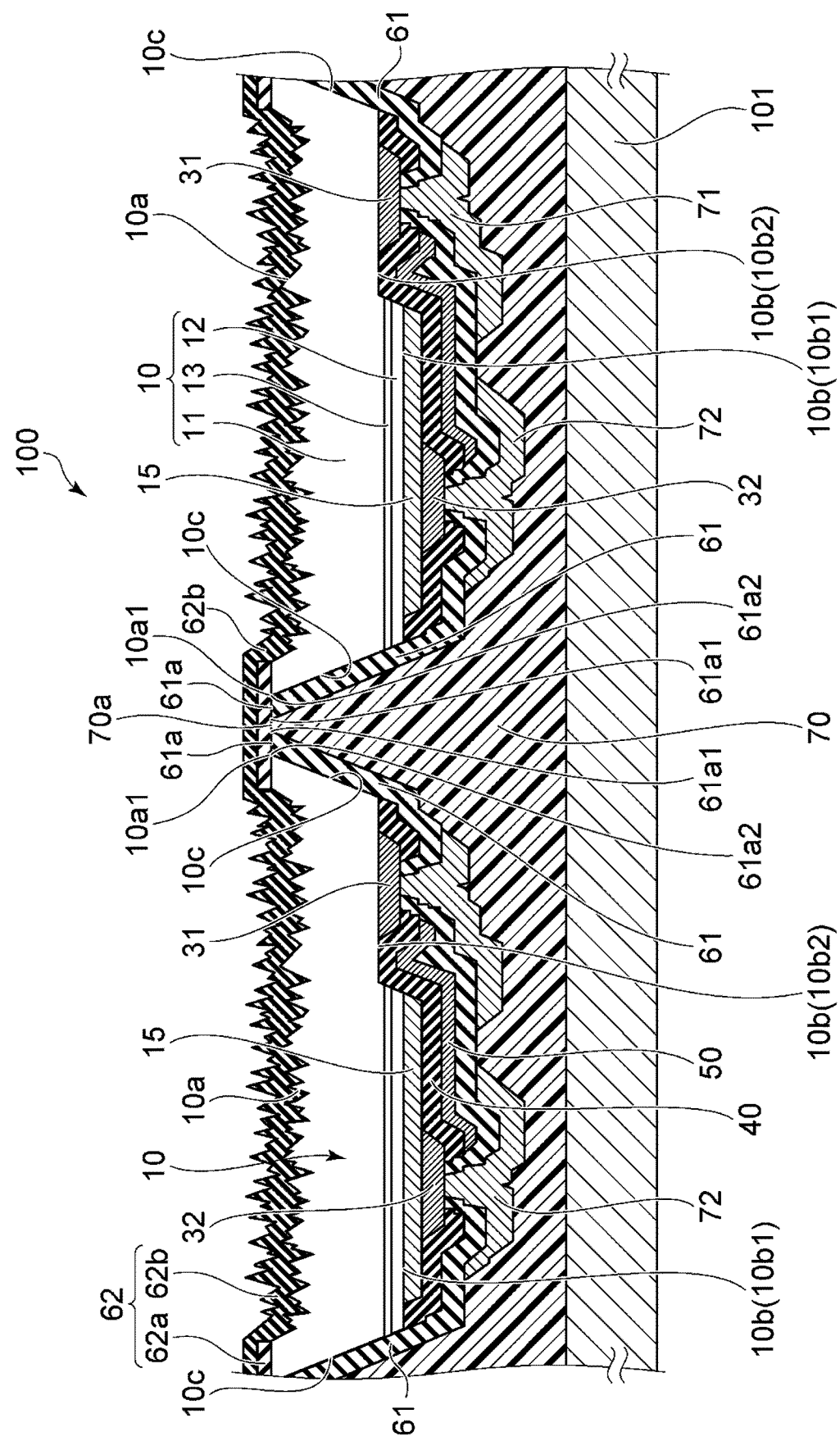
FIG. 8 is a cross-sectional view taken along a line VIII-VIII in FIG. 7.

A method for manufacturing a light-emitting element according to an embodiment of the present disclosure includes a step of providing a second structure 100 illustrated in FIGS. 7 and 8. The step of providing the second structure 100 includes a step of providing a first structure 110 illustrated in FIG. 1.

The step of providing the first structure 110 includes a step of forming a semiconductor structure body 10 on a growth substrate 102. For example, an insulating substrate such as sapphire or spinel ($MgAl_2O_4$) with any of a C surface, an R surface, and an A surface as a main surface can be used as the growth substrate 102. Further, a conductive substrate such as SiC (including 6H, 4H, and 3C), ZnS, ZnO, GaAs, and Si may be used as the growth substrate 102.

The semiconductor structure body 10 includes a nitride semiconductor such as $In_xAl_yGa_{1-x-y}N$ ($0 \leq x$, $0 \leq y$, $x+y \leq 1$). The semiconductor structure body 10 includes a first semiconductor layer 11, a second semiconductor layer 12, and an active layer 13 located between the first semiconductor layer 11 and the second semiconductor layer 12. For example, the first semiconductor layer 11 is an n-side semiconductor layer including an n-type semiconductor layer, and the second semiconductor layer 12 is a p-side semiconductor layer including a p-type semiconductor layer. The active layer 13 is a light-emitting layer that emits light. For example, the active layer 13 can include a plurality of barrier layers and a plurality of well layers, and can have a multi quantum well structure in which the barrier layer(s) and the well layer(s) are alternately layered. For example, the first semiconductor layer 11, the active layer 13, and the second semiconductor layer 12 are formed in this order on the growth substrate 102 by a metal organic chemical vapor deposition (MOCVD) method.

The semiconductor structure body 10 includes a first surface 10a, and a second surface 10b located on a side opposite to the first surface 10a. Further, a groove 80 is formed in the semiconductor structure body 10, and a lateral surface 10c exposed from the groove 80 is formed on the semiconductor structure body 10. The groove 80 is formed by removing a part of the semiconductor structure body 10 from the second semiconductor layer 12 side. As illustrated in FIG. 1, the groove 80 is formed so as not to reach the first surface 10a. Note that the groove 80 may be formed so as to reach the first surface 10a. The semiconductor structure body 10 can be removed by, for example, dry etching such as a reactive ion etching (RIE) method, or wet etching.

The second surface 10b of the semiconductor structure body 10 includes a first portion 10b1 and a second portions 10b2. The first portion 10b1 is a surface of the second semiconductor layer 12 in the second surface 10b (upper surface of the second semiconductor layer 12 in FIG. 1). The second portion 10b2 is a surface of the first semiconductor layer 11 in the second surface 10b (upper surface of the first semiconductor layer 11 in FIG. 1). Note that the second surface 10b of the semiconductor structure body 10 also includes a surface that connects the first portion 10b1 and the second portion 10b2, and the surface that connects the first portion 10b1 and the second portion 10b2 is formed of a lateral surface of the first semiconductor layer 11, a lateral surface of the second semiconductor layer 12, and a lateral surface of the active layer 13.

The step of providing the first structure 110 further includes a step of forming a current diffusion layer 15. The current diffusion layer 15 can be formed by a method such as a sputtering method or a vapor deposition method, for example. The current diffusion layer 15 is disposed on the first portion 10b1 of the second surface 10b of the semiconductor structure body 10. The current diffusion layer 15 has conductivity. Examples of a material of the current diffusion layer 15 that can be used include an oxide film such as indium tin oxide (ITO), aluminum zinc oxide (AZO), indium zinc oxide (IZO), and $Ga_2O_3$. The current diffusion layer 15 diffuses, in a plane direction of the second semiconductor layer 12, a current supplied through a second electrode 32 described below.

The step of providing the first structure 110 further includes a step of forming a first electrode 31 and the second electrode 32. The first electrode 31 and the second electrode 32 can be formed by a method such as a sputtering method, a vapor deposition method, and a chemical vapor deposition (CVD) method, for example. The first electrode 31 is disposed on the second portion 10b2 of the second surface 10b of the semiconductor structure body 10, and is electrically connected to the first semiconductor layer 11. The second electrode 32 is disposed on the current diffusion layer 15, and is electrically connected to the second semiconductor layer 12 through the current diffusion layer 15. Note that only the current diffusion layer 15 may be used as the second electrode 32. The first electrode 31 and the second electrode 32 are, for example, a metal layer of a single layer including Ti, Rh, Au, Pt, Al, Ag, Rh, or Ru, or a layered structure including at least two of these metal layers.

The step of providing the first structure 110 further includes a step of forming a first reflective layer 40. The first reflective layer 40 can be formed by a method such as a sputtering method, a vapor deposition method, a CVD method, and an atomic layer deposition (ALD) method, for example. The first reflective layer 40 covers the second surface 10b of the semiconductor structure body 10, the current diffusion layer 15, the first electrode 31, and the second electrode 32.

The first reflective layer 40 has high light reflectivity with respect to light from the active layer 13. The first reflective layer 40 has 70% or greater, preferably 80% or greater, and more preferably 90% or greater of light reflectivity with respect to a peak wavelength of the light from the active layer 13, for example. The first reflective layer 40 includes, for example, a dielectric multilayer film. The dielectric multilayer film includes, for example, $SiO_2$ layers and $Nb_2O_5$ layers that are alternately layered on each other. In the first reflective layer 40, it is preferable that, for example, after the $SiO_2$ layer having a thickness in a range from 100 nm to 500 nm is formed, two or more and six or less pairs of layers be formed as the dielectric multilayer film on the formed $SiO_2$ layer, each pair of layers configured of the $Nb_2O_5$ layer having a thickness in a range from 10 nm to 100 nm and the $SiO_2$ layer having a thickness in a range from 10 nm to 100 nm. By setting a film thickness of each layer and the number of layers of the first reflective layer 40 on a layer-type basis in such a manner, the first reflective layer 40 having high light reflectivity with respect to the light from the active layer 13 can be produced. For example, in the first reflective layer 40, after the $SiO_2$ layer of 300 nm is formed, three pairs of layers can be formed on the formed $SiO_2$ layer of 300 nm, each pair of layers configured of the $Nb_2O_5$ layer of 52 nm and the $SiO_2$ layer of 83 nm. Examples of a material of the first reflective layer 40 that can be used include titanium oxide ($TiO_2$), zirconium oxide ($ZrO_2$), aluminum oxide ($Al_2O_3$), and aluminum nitride (AlN).

The step of providing the first structure 110 further includes a step of forming a second reflective layer 50. The second reflective layer 50 can be formed by a method such as a sputtering method, a vapor deposition method, and a CVD method, for example. The second reflective layer 50 is disposed on a surface of the first reflective layer 40 (upper surface of the first reflective layer 40 in FIG. 1). The second reflective layer 50 is, for example, a metal layer. The second reflective layer 50 includes, for example, an Al layer, a Ti layer, or a layered structure of the Al layer and the Ti layer.

The step of providing the first structure 110 further includes a step of forming a first insulating film 61. The first insulating film 61 can be formed by a method such as a sputtering method, a vapor deposition method, a CVD method, and an ALD method, for example. The first insulating film 61 covers the lateral surface 10c and the second surface 10b of the semiconductor structure body 10. Further, the first insulating film 61 covers the upper surface of the first semiconductor layer 11 exposed from a bottom portion of the groove 80. Further, the first insulating film 61 covers the current diffusion layer 15, the first electrode 31, the second electrode 32, the first reflective layer 40, and the second reflective layer 50 that are disposed on the second surface 10b side. The first insulating film 61 has light transmissivity with respect to the light from the active layer 13. The first insulating film 61 is, for example, a silicon oxide film. In the example illustrated in FIG. 1, the first insulating film 61 is formed in a state where an opening exposing the first electrode 31 and an opening exposing the second electrode 32 are provided in the first reflective layer 40.

The step of providing the first structure 110 further includes a step of forming, in the first insulating film 61, a first opening 41 that exposes a part of the first electrode 31 from the first insulating film 61, and a second opening 42 that exposes a part of the second electrode 32 from the first insulating film 61. The first opening 41 is formed in a position overlapping the opening of the first reflective layer 40 that exposes the first electrode 31. The second opening 42 is formed in a position overlapping the opening of the first reflective layer 40 that exposes the second electrode 32.

The step of providing the first structure 110 further includes a step of forming a first conductive member 71 and a second conductive member 72. The first conductive member 71 and the second conductive member 72 are separated from each other on a surface of the first insulating film 61 (upper surface of the first insulating film 61 in FIG. 1).

A part of the first conductive member 71 is electrically connected to the first electrode 31 through the first opening 41. A part of the second conductive member 72 is electrically connected to the second electrode 32 through the second opening 42. The first conductive member 71 and the second conductive member 72 include, for example, a Ti layer, an Rh layer, an Ru layer, a Pt layer, an Au layer, or a layered structure including at least two metal layers of the metal layers.

Figure 2:
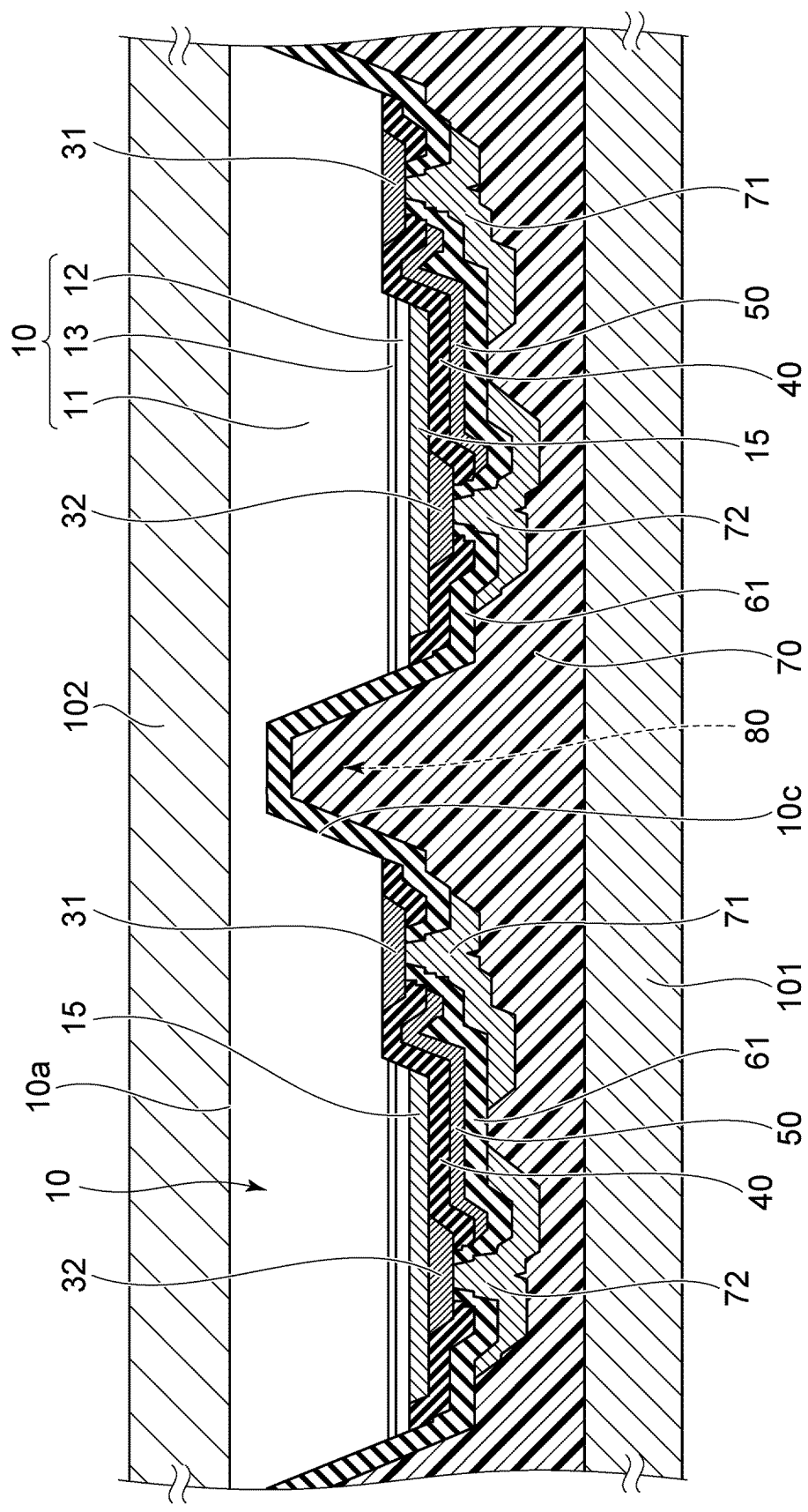
FIG. 2 is a cross-sectional view for illustrating a step of the method for manufacturing the light-emitting element according to the embodiment.

The first structure 110 is provided by the steps described above. Subsequently, as illustrated in FIG. 2, the semiconductor structure body 10 and a substrate 101 are bonded via a resin member 70. The resin member 70 is disposed between the substrate 101 and a plurality of the semiconductor structure bodies 10 and between the plurality of semiconductor structure bodies 10 (in the groove 80). The resin member 70 covers the first conductive member 71, the second conductive member 72, and the first insulating film 61. The plurality of semiconductor structure bodies 10 are supported above the substrate 101 with the resin member 70 interposed between the plurality of semiconductor structure bodies 10 and the substrate 101. The resin member 70 can include, for example, an epoxy resin, an acrylic resin, or a polyimide resin as a main component. The substrate 101 faces the second surface 10b of the semiconductor structure body 10. Examples of a material of the substrate 101 that can be used include sapphire, spinel, glass, SiC, ZnS, ZnO, GaAs, and Si.

Figure 3:
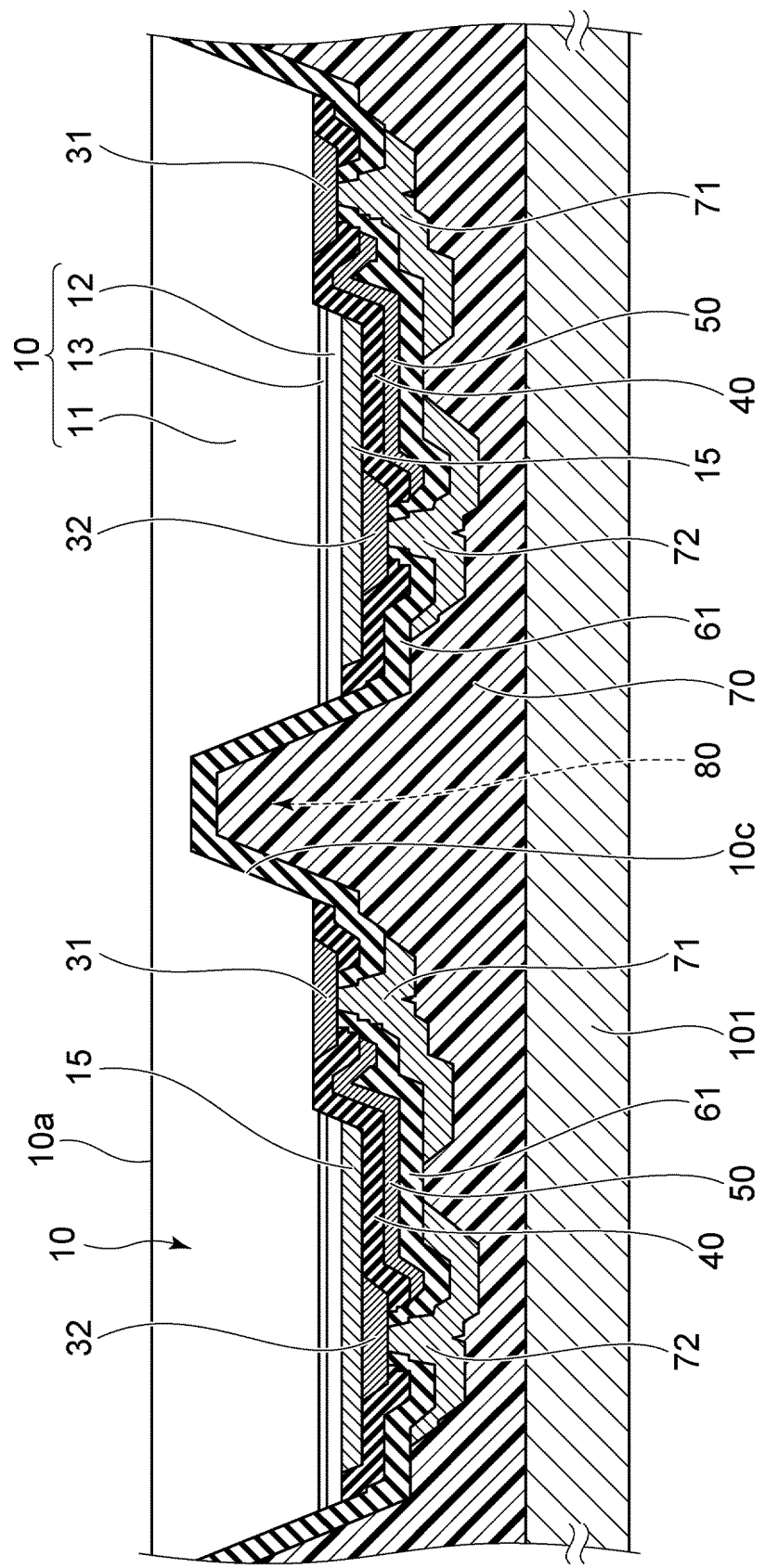
FIG. 3 is a cross-sectional view for illustrating a step of the method for manufacturing the light-emitting element according to the embodiment.

After the semiconductor structure body 10 and the substrate 101 are bonded, the growth substrate 102 is removed to expose the first surface 10a of the semiconductor structure body 10, as illustrated in FIG. 3. In the present specification, even when a part of the semiconductor structure body 10 constituting the first surface 10a is removed by removing the growth substrate 102, a surface on a side opposite to the second surface 10b of the semiconductor structure body 10 is referred to as the first surface 10a. The growth substrate 102 can be removed by a method such as a laser lift off (LLO) method, grinding, polishing, and etching.

The first surface 10a is, for example, a surface of gallium nitride (GaN), and laser light used for LLO is, for example, deep ultraviolet light. Ga of gallium nitride is sublimated by irradiating the first surface 10a with the laser light, and thus the growth substrate 102 is peeled from the first surface 10a. In a step of forming the groove 80, by leaving a part of the semiconductor structure body 10 between the bottom surface of the groove 80 and the growth substrate 102, the first surface 10a is present across the entire surface of the growth substrate 102 during LLO. In this way, peeling of the growth substrate 102 by the LLO method is facilitated.

Figure 4:
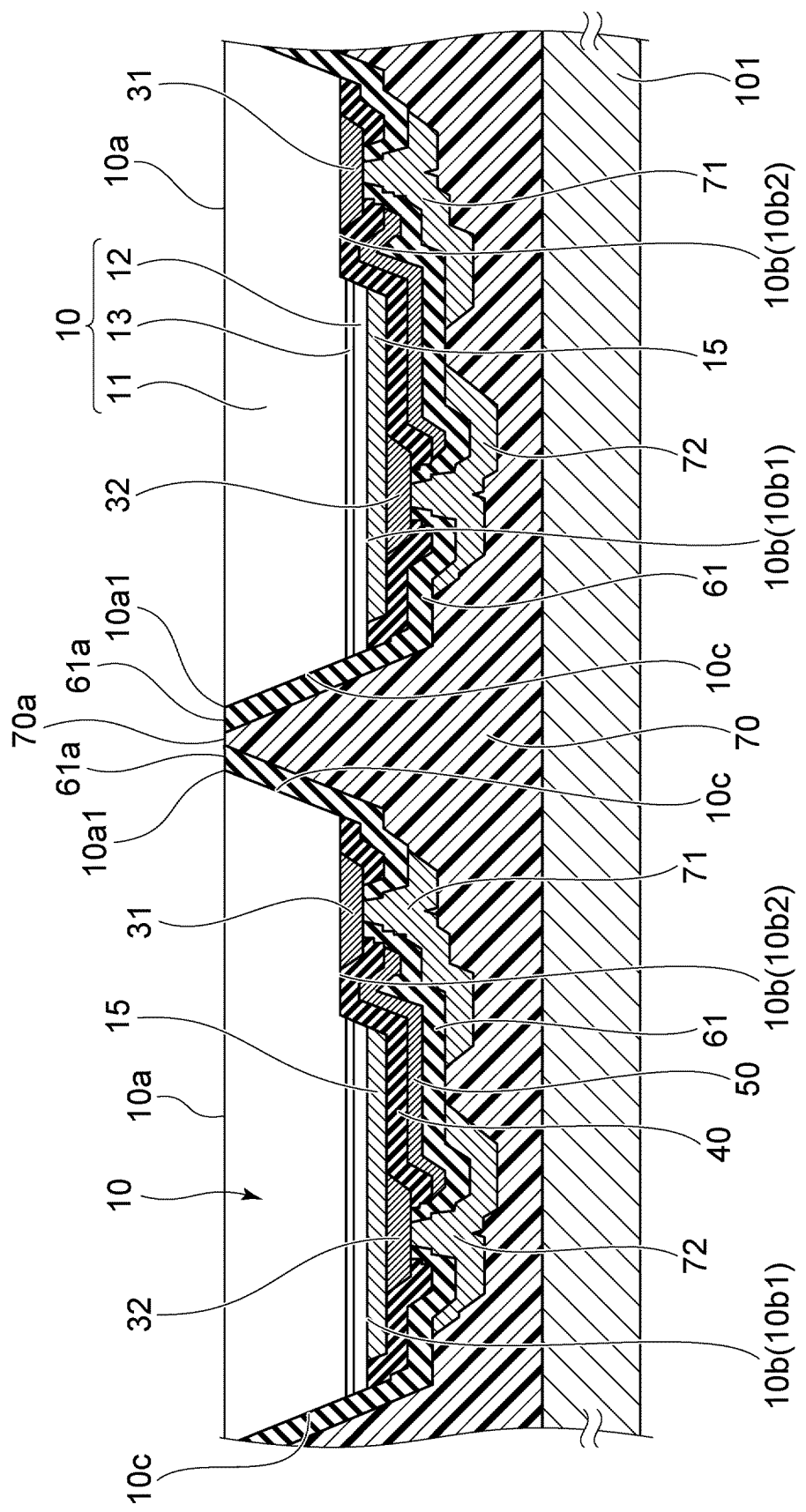
FIG. 4 is a cross-sectional view for illustrating a step of the method for manufacturing the light-emitting element according to the embodiment.

Flatness of the first surface 10a is improved by removing the first semiconductor layer 11 by, for example, a chemical mechanical polishing (CMP) method and/or etching such as an RIE method after the growth substrate 102 is removed. In the present specification, the first surface 10a having the improved flatness is also referred to as the first surface 10a. As illustrated in FIG. 4, in the step of improving the flatness of the first surface 10a, a part of the first semiconductor layer 11 is removed so as to reach a surface of the semiconductor structure body 10 that defines the bottom portion of the groove 80. As a result, the semiconductor structure body 10 is separated into a plurality of portions. Further, an upper surface 70a of the resin member 70 and an upper surface 61a of the first insulating film 61 on the first surface 10a side are exposed between adjacent semiconductor structure bodies 10. Further, an outer edge 10al connected to the lateral surface 10c is formed on the first surface 10a. The outer edge 10al is an outer edge of the first surface 10a in a top view after the semiconductor structure body 10 is separated. The lateral surface 10c connects the first surface 10a and the second surface 10b.

Figure 5:
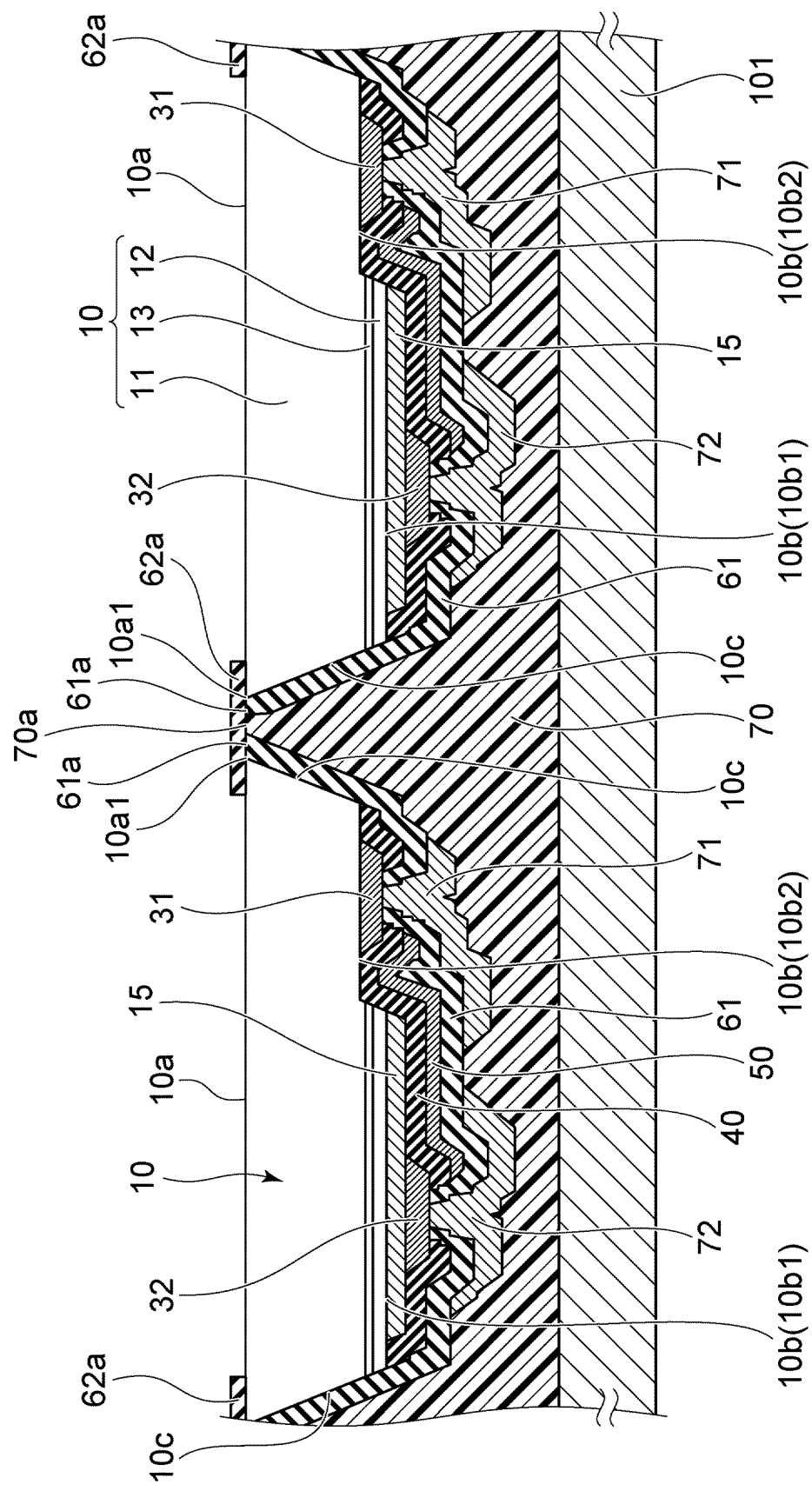
FIG. 5 is a cross-sectional view for illustrating a step of the method for manufacturing the light-emitting element according to the embodiment.

Subsequently, a step of forming a second insulating film 62 is performed. The step of forming the second insulating film 62 includes a step of forming a first film 62a as illustrated in FIG. 5. The first film 62a covers the first surface 10a in a region near the outer edge 10al of the first surface 10a. The first film 62a also covers the upper surface 61a of the first insulating film 61 and the upper surface 70a of the resin member 70 between the adjacent semiconductor structure bodies 10. The first film 62a has light transmissivity with respect to the light from the active layer 13. The first film 62a is, for example, a silicon oxide film. After the first film 62a is formed on the entire surface of the first surface 10a by, for example, a sputtering method and a CVD method, the first film 62a other than that in the region near the outer edge 10al of the first surface 10a is removed by an RIE method using a resist mask.

Figure 6:
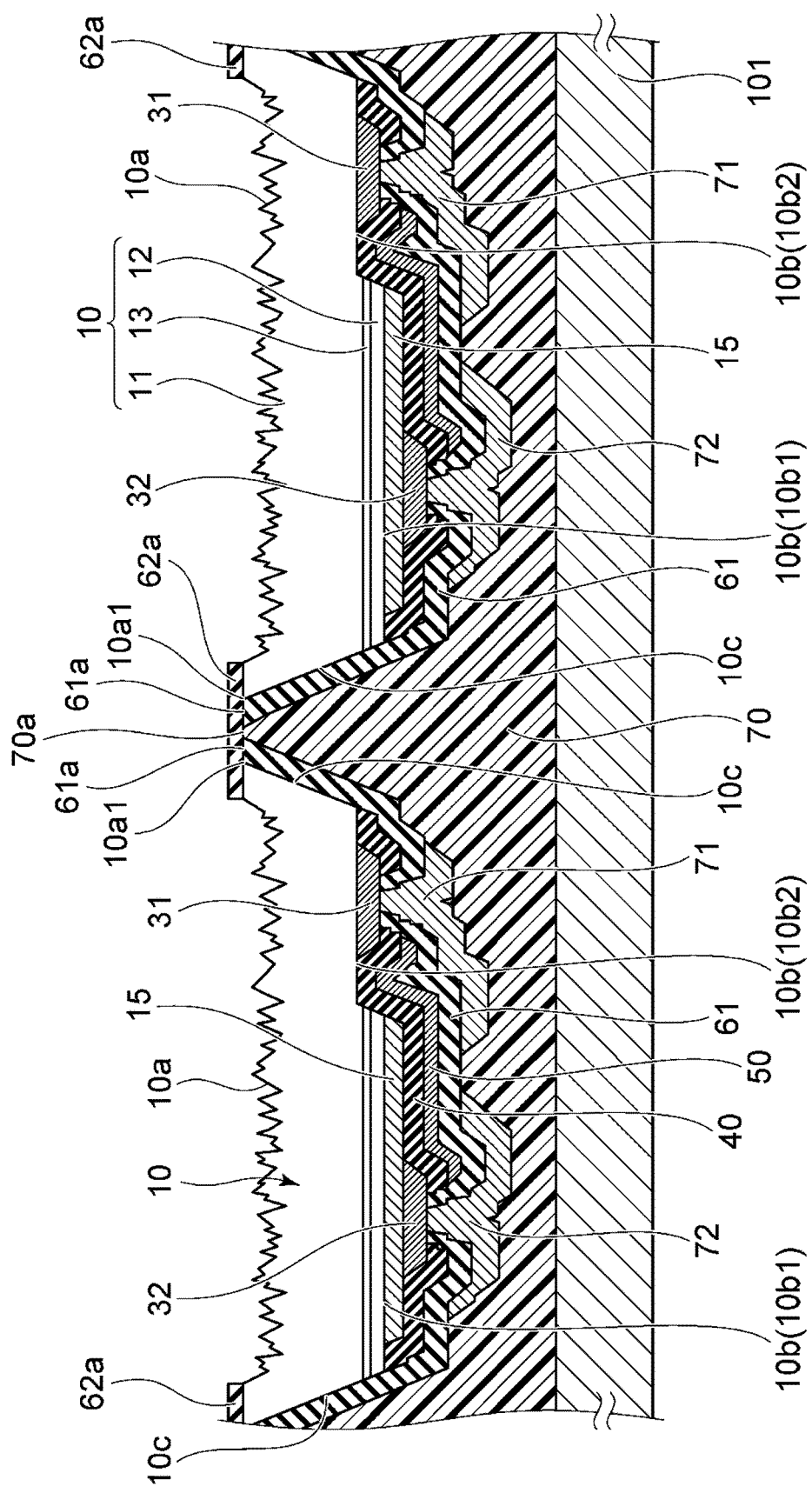
FIG. 6 is a cross-sectional view for illustrating a step of the method for manufacturing the light-emitting element according to the embodiment.

After the first film 62a is formed, a step of roughening a region in the first surface 10a exposed from the first film 62a is performed as illustrated in FIG. 6. The first surface 10a is a main light-extraction surface in the light-emitting element, and light extraction efficiency of the light-emitting element can be improved by setting the first surface 10a as a rough surface.

In the step of roughening the first surface 10a, the region near the outer edge 10al of the first surface 10a protected by the first film 62a of the first surface 10a is not roughened. When the entire surface of the first surface 10a is roughened, chipping of the first semiconductor layer 11 easily occurs in the region near the outer edge 10al of the first surface 10a. Therefore, the region near the outer edge 10al of the first surface 10a is not roughened, and thus chipping of the first semiconductor layer 11 that easily occurs in the region near the outer edge 10al of the first surface 10a can be reduced. Wet etching using an alkaline solution such as tetramethylammonium hydroxide (TMAH) is performed in a state where the region near the outer edge 10al of the first surface 10a is covered with the first film 62a. In this way, the region near the outer edge 10al of the first surface 10a is not roughened, and the region inward of the outer edge 10al of the first surface 10a excluding the region near the outer edge 10al can be roughened. Here, in the top view, the region near the outer edge 10al of the first surface 10a is preferably a region of the first surface 10a in a range within 10 μm from the outer edge 10al of the first surface 10a, and is more preferably a region in a range within 5 μm, for example. Further, for example, the region inward of the outer edge 10al of the first surface 10a excluding the region near the outer edge 10al may be roughened by reactive ion etching (RIE) with gas containing chlorine. In this case, the region inward of the outer edge 10al of the first surface 10a excluding the region near the outer edge 10al can be roughened by forming a mask having an opening in the region inward of the outer edge 10al of the first surface 10a excluding the region near the outer edge 10al, and subsequently removing the first semiconductor layer 11 exposed from the mask by RIE.

The step of forming the second insulating film 62 includes a step of forming a second film 62b after the step of roughening the first surface 10a. As illustrated in FIG. 8, the second film 62b covers the roughened region of the first surface 10a and the first film 62a. The second film 62b has light transmissivity with respect to the light from the active layer 13. The second film 62b is, for example, a silicon oxide film. The second insulating film 62 formed of the first film 62a and the second film 62b continuously covers the first surfaces 10a of the semiconductor structure body 10, the first film 62a, the upper surface 61a of the first insulating film 61 between the adjacent semiconductor structure bodies 10, and the upper surface 70a of the resin member 70 between the adjacent semiconductor structure bodies 10.

As described above, the second structure 100 illustrated in FIGS. 7 and 8 is provided. The second structure 100 includes the one or the plurality of semiconductor structure bodies 10. For example, four semiconductor structure bodies 10 are illustrated in the top view in FIG. 7. FIG. 8 being a cross-sectional view taken along a line VIII-VIII in FIG. 7 illustrates two adjacent semiconductor structure bodies 10. The plurality of semiconductor structure bodies 10 are separated from one another.

Figure 9:
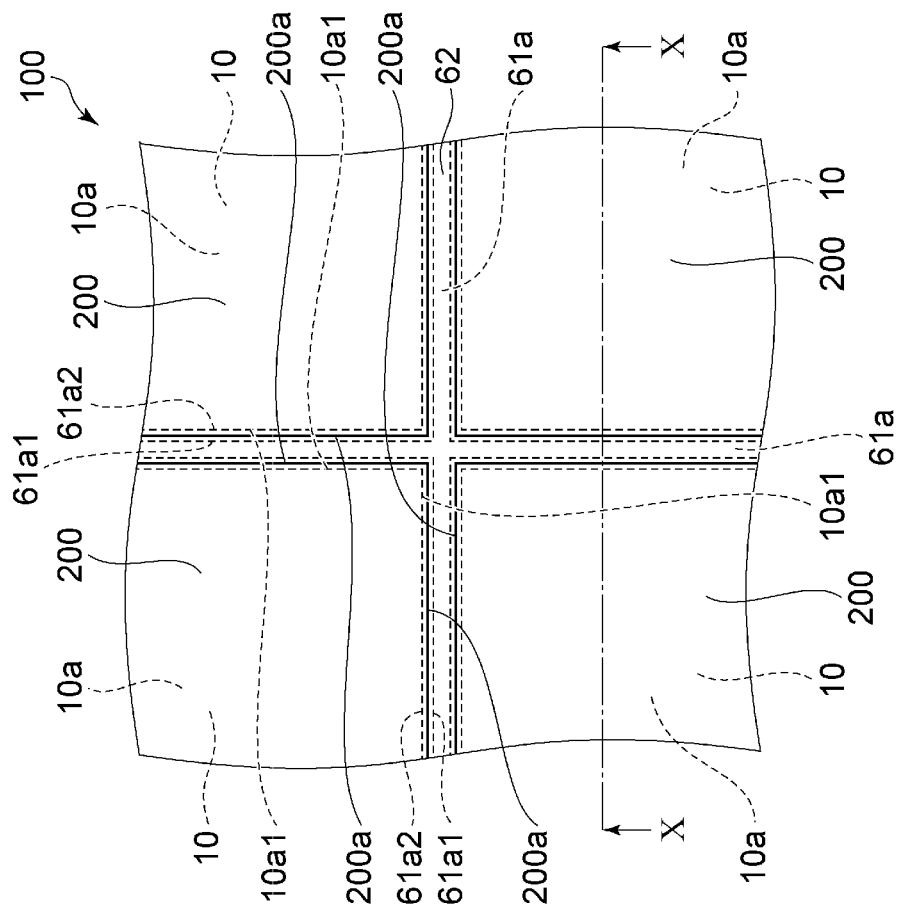
FIG. 9 is a top view for illustrating a step of the method for manufacturing the light-emitting element according to the embodiment.
Figure 10:
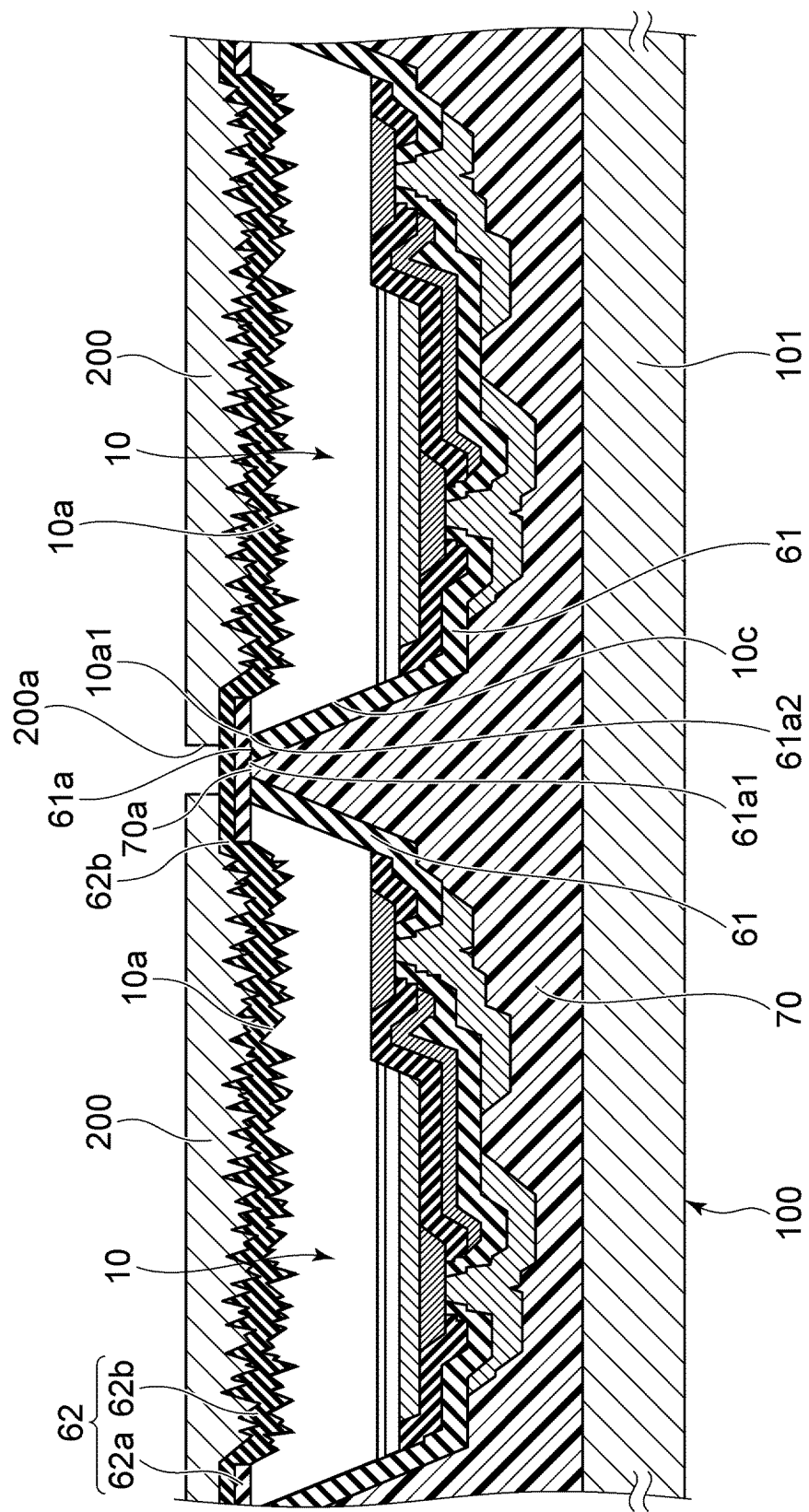
FIG. 10 is a cross-sectional view taken along a line X-X in FIG. 9.

After the second structure 100 is provided, the method for manufacturing the light-emitting element according to the embodiment further includes a step of forming a mask 200 on a part of the second insulating film 62 located above the first surface 10a as illustrated in FIGS. 9 and 10.

For example, a resist layer can be used for the mask 200. After the resist layer is formed on the entire surface of the second insulating film 62 of the second structure 100, the mask 200 is formed by removing a part of the resist layer by exposure and development processing. As illustrated in FIG. 9, the mask 200 is formed so as to cover the first surface 10a of each of the semiconductor structure bodies 10. Therefore, as illustrated in FIG. 9, in the top view, the mask 200 is formed such that a gap between a plurality of the masks 200 has a grid pattern. The mask 200 covers the entire surface of the first surface 10a of each of the semiconductor structure bodies 10 with the second insulating film 62 interposed between the mask 200 and the first surface 10a.

The upper surface 61a of the first insulating film 61 that covers the lateral surface 10c of the semiconductor structure body 10 includes a first end 61a1 and a second end 61a2. In the top view, the second end 61a2 is located between the first end 61a1 and the outer edge 10al of the first surface 10a. In FIG. 9, the second end 61a2 and the outer edge 10al of the first surface 10a are indicated by the same line. In the top view, the second end 61a2 is located on a side closer to the first surface 10a than the first end 61a1. In the top view, the second end 61a2 surrounds the first surface 10a.

In the step of forming the mask 200, an outer edge 200a in the top view of each of the masks 200 located above the corresponding semiconductor structure body 10 is located between the first end 61a1 and the second end 61a2 of the upper surface 61a of the first insulating film 61 that covers the lateral surface 10c of the semiconductor structure body 10. In the top view, a part of the second insulating film 62 located around the mask 200 is exposed from the mask 200. In other words, in the top view, the part of the second insulating film 62 located between the adjacent semiconductor structure bodies 10 is exposed from the mask 200.

After the step of forming the mask 200, the method for manufacturing the light-emitting element according to the embodiment further includes a step of removing the part of the second insulating film 62 exposed from the mask 200. For example, the part of the second insulating film 62 is removed by etching the second insulating film 62 with gas containing fluorine.

Figure 11:
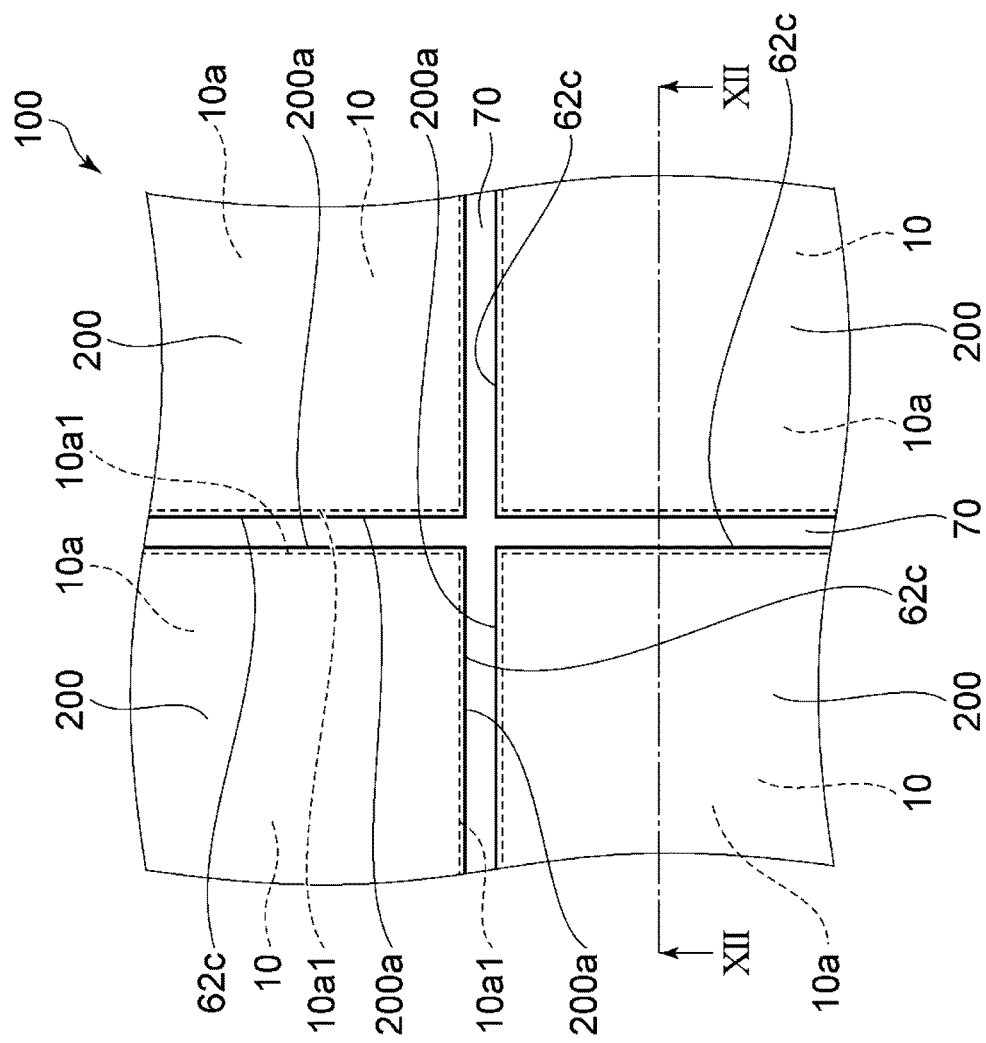
FIG. 11 is a top view for illustrating a step of the method for manufacturing the light-emitting element according to the embodiment.
Figure 12:
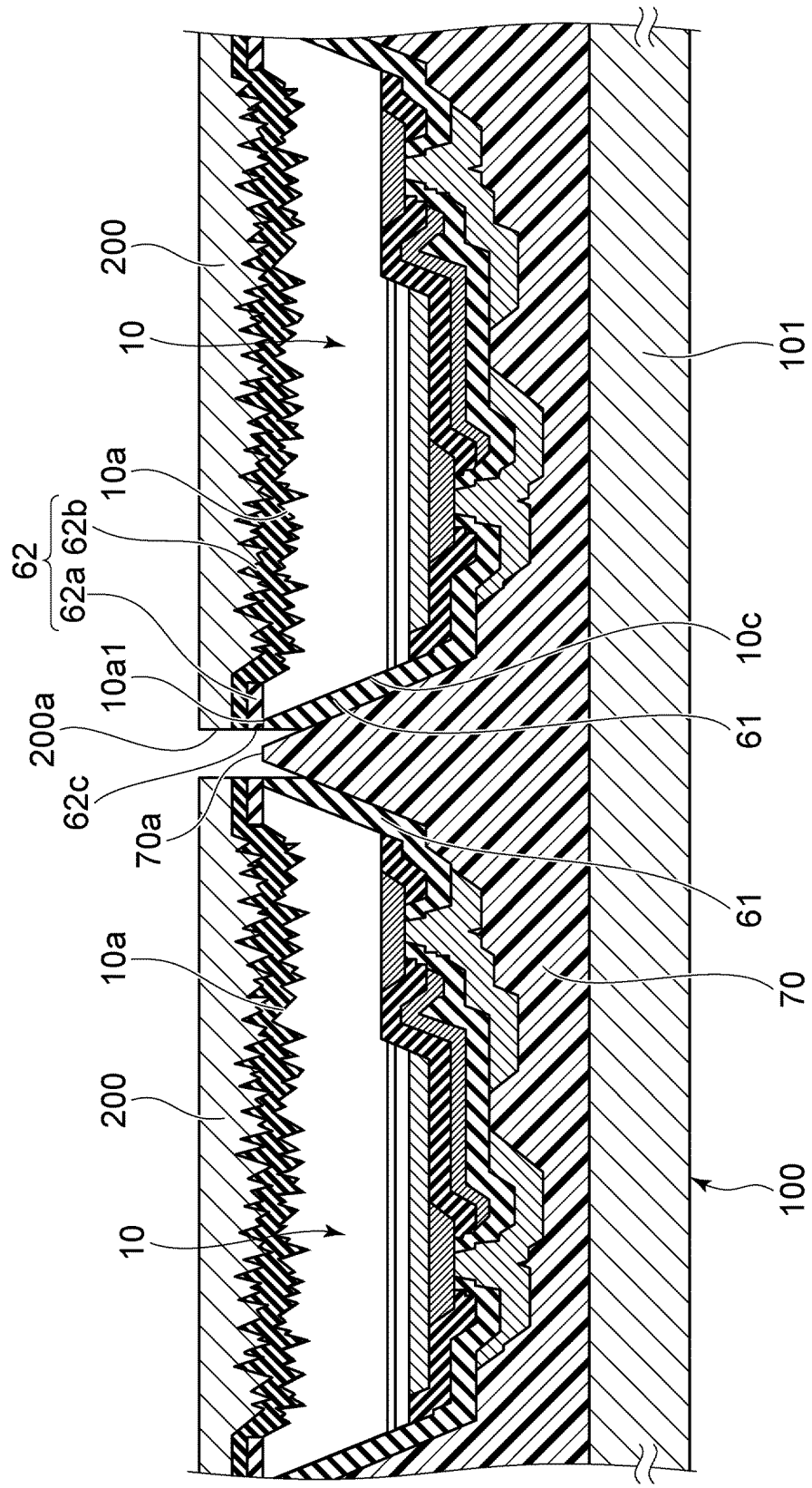
FIG. 12 is a cross-sectional view taken along a line XII-XII in FIG. 11.

FIG. 11 is a top view of the second structure 100 after the part of the second insulating film 62 is removed, and FIG. 12 is a cross-sectional view taken along a line XII-XII in FIG. 11.

In the step of removing the part of the second insulating film 62, the part of the second insulating film 62 is removed such that an outer edge 62c of the second insulating film 62 is located in a region of the first insulating film 61 located outside the first surface 10a of the semiconductor structure body 10 in the top view. "The outer edge 62c of the second insulating film 62 is located in the region of the first insulating film 61 located outside the first surface 10a of the semiconductor structure body 10" includes a case in which the outer edge 62c of the second insulating film 62 overlaps an outer edge of the first insulating film 61 in the top view. In the top view, the part of the second insulating film 62 is removed such that the outer edge 62c of the second insulating film 62 is located outside the outer edge 10al of the first surface 10a and outside the lateral surface 10c, and the first surface 10a and the lateral surface 10c of the semiconductor structure body 10 are not exposed from the second insulating film 62. The part of the second insulating film 62 is removed to expose, from the second insulating film 62, a part of the first insulating film 61 and the upper surface 70a of the resin member 70 that are located between the adjacent semiconductor structure bodies 10.

In the example illustrated in FIG. 12, after the part of the second insulating film 62 is removed, a part of the first insulating film 61 located below the second insulating film 62 is also removed so as not to remain the first insulating film 61 below a region in which the part of the second insulating film 62 is removed. The first insulating film 61 is a film of the same material as that of the second insulating film 62 (for example, a silicon oxide film), and thus the second insulating film 62 and the first insulating film 61 can be successively etched by using gas containing fluorine. In an etching condition for removing the part of the second insulating film 62, the resin member 70 is hardly etched.

After the step of removing the part of the second insulating film 62, the method for manufacturing the light-emitting element according to the embodiment further includes a step of removing the resin member 70 from the upper surface 70a side of the resin member 70 exposed from the second insulating film 62. The resin member 70 is removed by, for example, etching. The etching of the resin member 70 can use gas that can also remove the mask 200 simultaneously. For example, the resin member 70 is etched by using gas containing oxygen. In an etching condition for removing the resin member 70, the first insulating film 61 and the second insulating film 62 are hardly etched.

Figure 13:
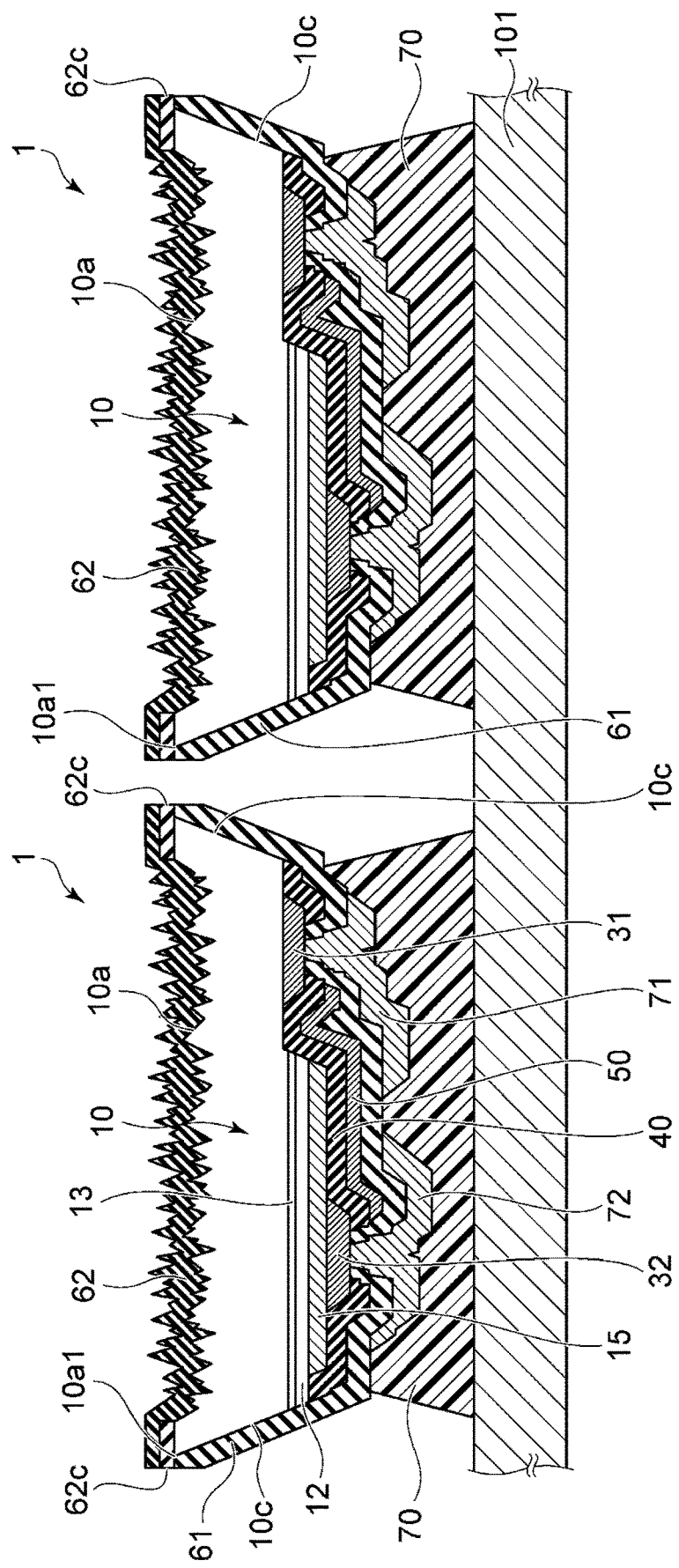
FIG. 13 is a cross-sectional view of the light-emitting element produced by the method for manufacturing the light-emitting element according to the embodiment.
Figure 14:
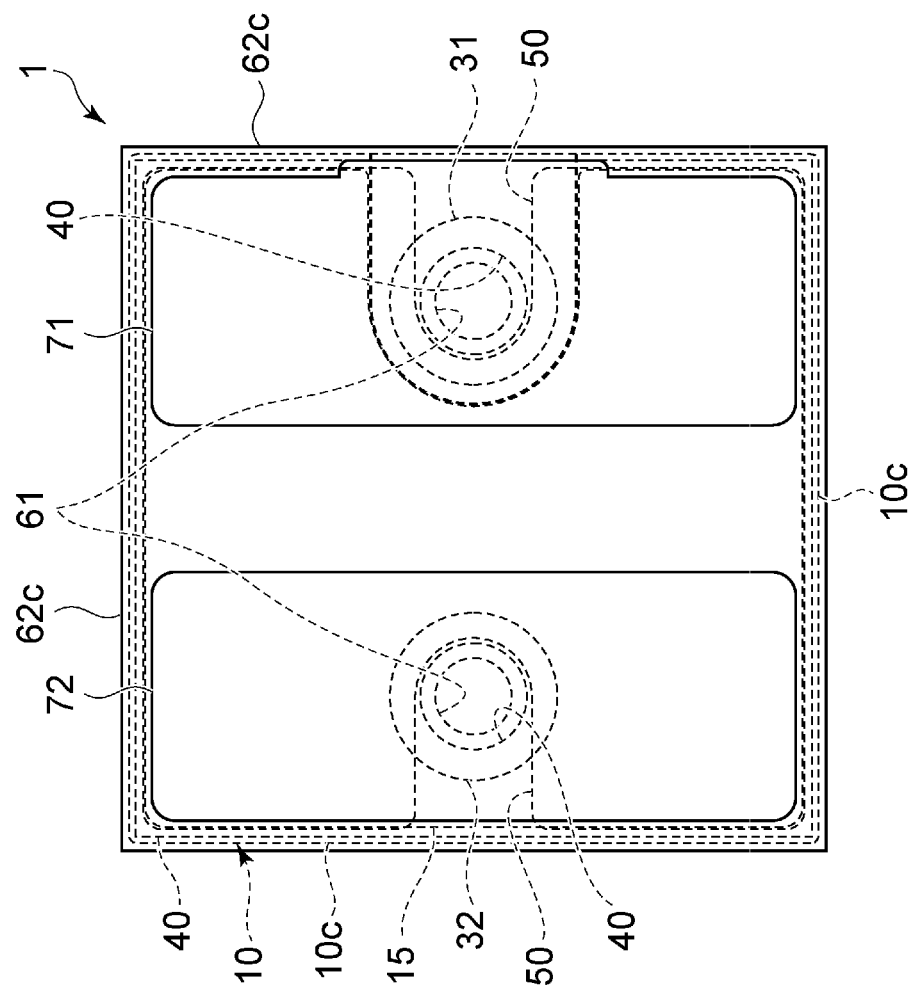
FIG. 14 is a bottom view of the light-emitting element illustrated in FIG. 13.

A part of the resin member 70 located between the adjacent semiconductor structure bodies 10 is removed by etching. In this way, as illustrated in FIG. 13, a plurality of light-emitting elements 1 separated from an adjacent light-emitting element across a space on the substrate 101 are produced. FIG. 13 illustrates two light-emitting elements 1. The resin member 70 between the substrate 101 and the semiconductor structure body 10 is left to remain. The light-emitting element 1 is supported above the substrate 101 with the resin member 70 interposed between the light-emitting element 1 and the substrate 101 while the light-emitting element 1 is separated from other light-emitting elements 1. FIG. 14 is a bottom view of one light-emitting element 1 illustrated in FIG. 13.

For example, by irradiating the resin member 70 with the laser light from the substrate 101 side, a part of the resin member 70 between the substrate 101 and the semiconductor structure body 10 can be removed, and the light-emitting element 1 can be separated from the substrate 101. A surface on the second insulating film 62 side of the light-emitting element 1 separated from the substrate 101 is bonded to a different support substrate having adhesion. Separation of the light-emitting element 1 from the substrate 101 by the laser light can be performed after bonding the light-emitting element 1 to the different support substrate.

Subsequently, the resin member 70 remaining on the light-emitting element 1 is removed to expose the first conductive member 71 and the second conductive member 72. The resin member 70 remaining on the light-emitting element 1 can be removed by, for example, an RIE method. The first conductive member 71 and the second conductive member 72 exposed by removing the resin member 70 function as external connection terminals bonded to a mounting substrate. The light-emitting element 1 according to the embodiment is, for example, a light-emitting diode (LED).

According to the light-emitting element 1 of the embodiment, the light from the active layer 13 is mainly extracted from the first surface 10a to the outside. Furthermore, the light from the active layer 13 is also extracted from the lateral surface 10c of the first semiconductor layer 11 to the outside. According to the embodiment, the first reflective layer 40 is disposed on the second surface 10b side located on the side opposite to the first surface 10a, and the reflective layer is not disposed on the lateral surface 10c, and thus the light extraction efficiency from the light-emitting element 1 to the outside can be increased. Note that when a size of the light-emitting element 1 is reduced, proportion of a light extraction surface of the light-emitting element 1 occupied by the lateral surface 10c is increased, and thus proportion of light extracted from the lateral surface 10c is increased. Therefore, a structure in which the reflective layer is not disposed on the lateral surface 10c has a great effect when the size of one side of the light-emitting element 1 is equal to or less than 100 μm, and has a greater effect when the size of one side of the light-emitting element 1 is equal to or less than 60 μm.

Forming a dielectric multilayer film as the first reflective layer 40 enables a reflectance to be increased as compared to a case in which the first reflective layer 40 is a metal layer. The reflectance can be further increased by further disposing the second reflective layer 50 on the second surface 10b side.

Here, a method for manufacturing a light-emitting element according to a comparative example will be described.

In the comparative example, in the step of forming the mask 200 illustrated in FIG. 10, the outer edge 200a of the mask 200 in the top view is located outside the first end 61a1 of the upper surface 61a of the first insulating film 61. In other words, the outer edge 200a the mask 200 in the top view of is located above the upper surface 70a of the resin member 70 between the adjacent semiconductor structure bodies 10.

Figure 17:
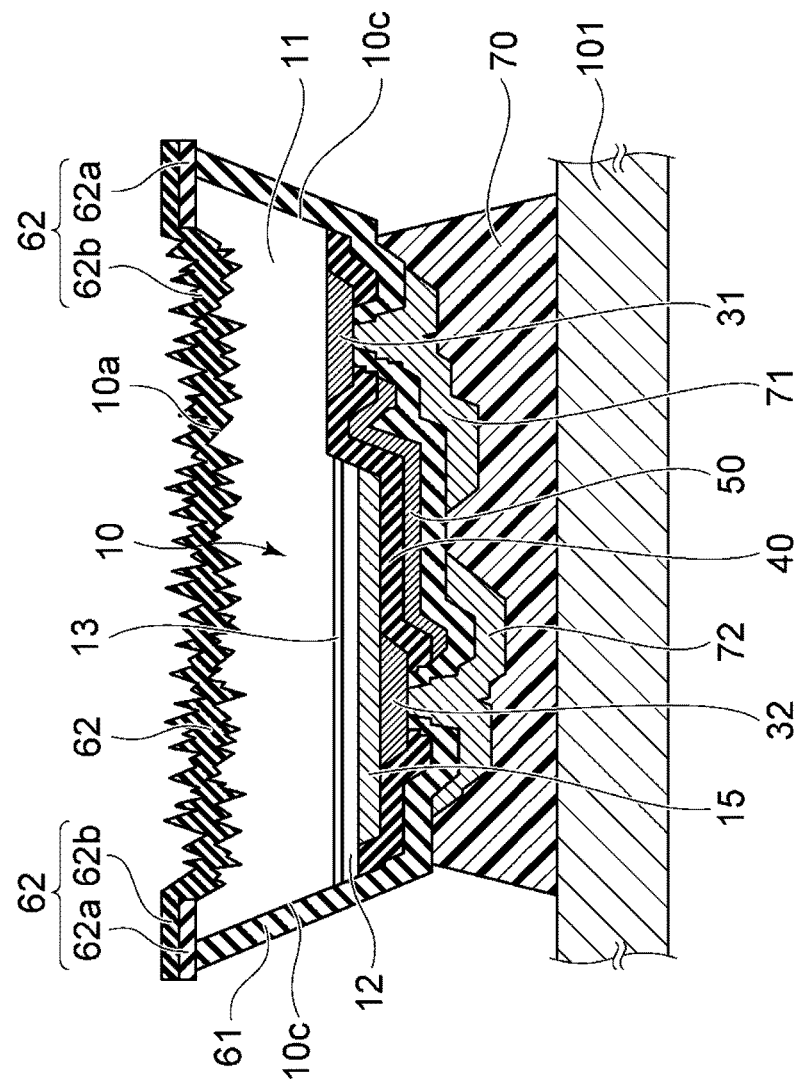
FIG. 17 is a cross-sectional view of a light-emitting element produced by a method for manufacturing a light-emitting element according to a comparative example.

A part of the second insulating film 62 is removed by using the mask 200, and the resin member 70 between the adjacent semiconductor structure bodies 10 is further removed from the upper surface 70a of the resin member 70 exposed from the second insulating film 62 by removing the part of the second insulating film 62. In the light-emitting element produced by the manufacturing method according to the comparative example, as illustrated in FIG. 17, the part of the second insulating film 62 is located outside the first insulating film 61. The part of the second insulating film 62 located outside the first insulating film 61 is easily chipped during a manufacturing step. When the light-emitting element is mounted on a mounting substrate, the chipped portion of the second insulating film 62 is interposed between the mounting substrate and the first conductive member 71 and/or between the mounting substrate and the second conductive member 72, and may thus cause poor bonding.

According to the embodiment, as illustrated in FIG. 10, in the step of forming the mask 200, the outer edge 200a in the top view of the mask 200 is located between the first end 61a1 and the second end 61a2 of the upper surface 61a of the first insulating film 61. When the part of the second insulating film 62 is removed by using the mask 200, as illustrated in FIG. 12, the second insulating film 62 is less likely to be formed outside the first insulating film 61. In this way, chipping of the second insulating film 62 can be reduced, and bonding performed when the light-emitting element 1 is mounted on the mounting substrate can be performed in a good manner.

Further, as illustrated in FIG. 12, by removing the first insulating film 61 so that the first insulating film 61 does not remain below the region in which the part of the second insulating film 62 is removed, the outer edge 62c of the second insulating film 62 and the outer edge of the first insulating film 61 overlap in the top view. In this way, chipping of the first insulating film 61 can be reduced, and bonding when the light-emitting element 1 is mounted on the mounting substrate can be performed in a good manner.

A film thickness of the first insulating film 61 is preferably greater than a film thickness of the second insulating film 62. In this way, in the step of forming the mask 200, the outer edge 200a the mask 200 in the top view of is easily located between the first end 61a1 and the second end 61a2 of the upper surface 61a of the first insulating film 61. Increasing the film thickness of the first insulating film 61 makes it easy to locate the outer edge 200a of the mask 200 above the upper surface 61a of the first insulating film 61. On the other hand, the increase in the film thickness of the first insulating film 61 leads to a decrease in manufacturing efficiency due to an increase in film formation time of the first insulating film 61. Thus, the film thickness of the first insulating film 61 is preferably in a range from 100 nm to 3000 nm, more preferably in a range from 400 nm to 2500 nm, and further more preferably in a range from 500 nm to 1500 nm on the lateral surface 10c of the semiconductor structure body 10. Further, the film thickness of the second insulating film 62 is preferably in a range from 50 nm to 2500 nm, more preferably in a range from 200 nm to 1500 nm, and further more preferably in a range from 400 nm to 1200 nm, for example. Setting the film thickness of the second insulating film 62 to have such a film thickness enables protection of the first surface 10a while reducing a decrease in the extraction efficiency of the light from the first surface 10a. Further, a film thickness of the first film 62a is preferably in a range from 50 nm to 200 nm. Setting the film thickness of the first film 62a to have such a thickness enables protection of the region near the outer edge 10al of the first surface 10a while reducing a decrease in the extraction efficiency of the light from the first surface 10a. A film thickness of the second film 62b is preferably in a range from 1 nm to 2300 nm, more preferably in a range from 150 nm to 1300 nm, and further more preferably in a range from 350 nm to 1000 nm, for example.

Figure 15:
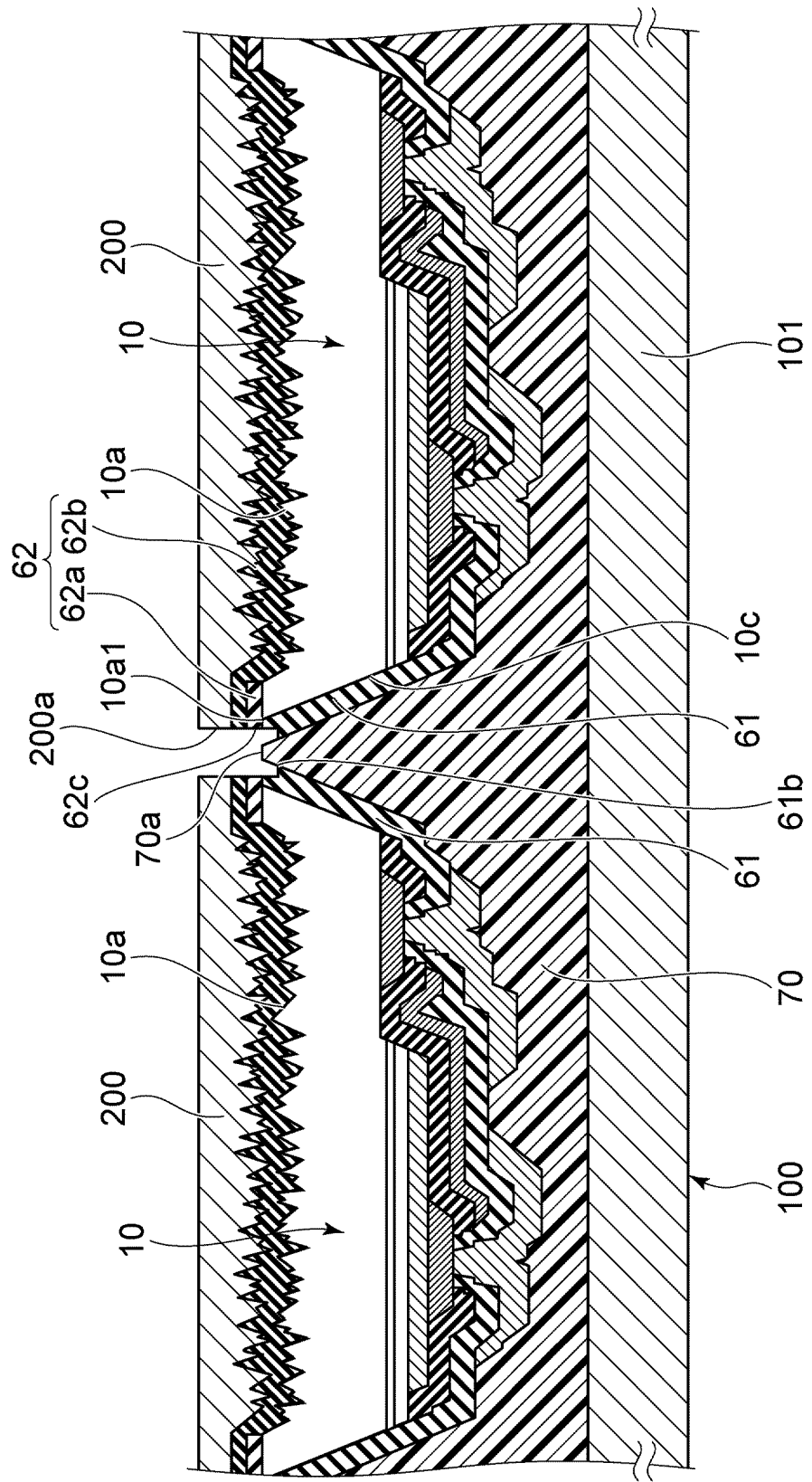
FIG. 15 is a cross-sectional view for illustrating a step of a modification example of the method for manufacturing the light-emitting element according to the embodiment.

A modification example of the method for manufacturing the light-emitting element according to the embodiment will be described with reference to FIGS. 15 and 16. In the modification example, as illustrated in FIG. 15, in the step of removing the part of the second insulating film 62, when the part of the second insulating film 62 is removed and the first insulating film 61 located below the second insulating film 62 is then removed, the removal is performed such that a part 61b of the first insulating film 61 remains below the region in which the part of the second insulating film 62 is removed. In this way, etching time can be reduced as compared to a case in which a part of the first insulating film 61 does not remain below the region in which the part of the second insulating film 62 is removed.

Figure 16:
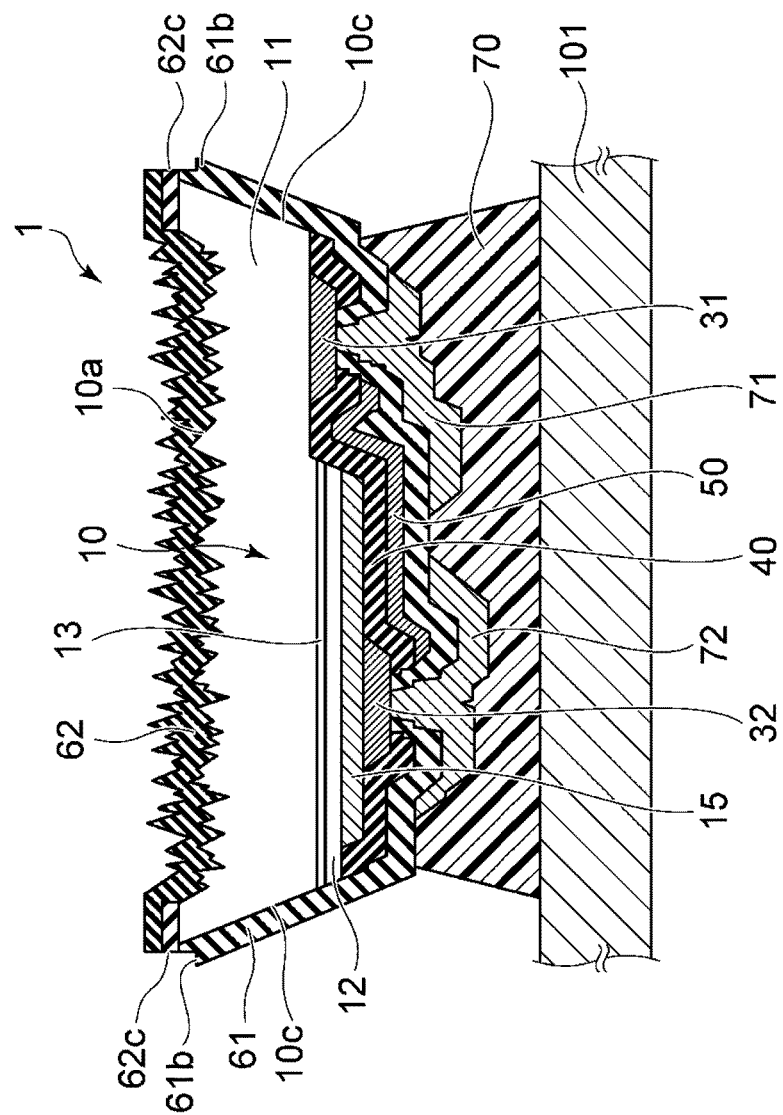
FIG. 16 is a cross-sectional view of the light-emitting element produced by the method for manufacturing the light-emitting element illustrated in FIG. 15.

FIG. 16 is a cross-sectional view of the light-emitting element 1 produced by the step illustrated in FIG. 15. The part 61b of the first insulating film 61 is located outside the outer edge 62c of the second insulating film 62. The second insulating film 62 tends to be easily chipped in a portion located outside the outer edge of the first insulating film 61. On the other hand, the part 61b of the first insulating film 61 is less likely to be chipped during the manufacturing step as compared to the part of the second insulating film 62 located outside the outer edge of the first insulating film 61 illustrated in FIG. 17. Therefore, also in the manufacturing method according to the modification example, the light-emitting element 1 in which occurrence of chipping of the second insulating film 62 is reduced can be manufactured. The part 61b of the first insulating film 61 is present when the light-emitting element 1 is mounted on a mounting substrate and a lateral surface of the light-emitting element 1 on the mounting substrate is then covered with a protective member such as, for example, a resin, and thus a contact area of the protective member with the first insulating film 61 is increased as compared to a case in which the part 61b of the first insulating film 61 is not present. Thus, an adhesion force between the light-emitting element 1 and the protective member can be increased.

Embodiments of the present invention have been described above with reference to specific examples. However, the present invention is not limited to these specific examples. All aspects that can be practiced by a person skilled in the art modifying the design as appropriate based on the above-described embodiments of the present invention are also included in the scope of the present invention, as long as they encompass the spirit of the present invention. In addition, in the spirit of the present invention, a person skilled in the art can conceive of various alterations and modifications, and those alterations and modifications will also fall within the scope of the present invention.

What is claimed is:

1. A method for manufacturing a light-emitting element, the method comprising:
   providing a structure body comprising:
      a semiconductor structure body having a first surface, a second surface located on a side opposite to the first surface, and a lateral surface that connects the first surface and the second surface,
      a first insulating film covering the lateral surface of the semiconductor structure body,
      a second insulation film covering the first surface of the semiconductor structure body and an upper surface of the first insulating film on a first surface side, and
   a substrate facing the second surface of the semiconductor structure body;
      forming a mask on a part of the second insulating film located above the first surface of the semiconductor structure body; and
      removing a part of the second insulating film located around the mask in a top view and exposed from the mask, wherein:
      in the step of removing the part of the second insulating film, the part of the second insulating film is removed such that, in a top view, an outer edge of the second insulating film is located in a region of the first insulating film located outside the first surface of the semiconductor structure body.

2. The method according to claim 1, wherein:
   the upper surface of the first insulating film includes a first end, and a second end located between the first end and an outer edge of the first surface of the semiconductor structure body in the top view, and
   in the step of forming the mask, in the top view, an outer edge of the mask is located between the first end and the second end.

3. The method according to claim 1, wherein:
   in the step of removing the part of the second insulating film, the part of the second insulating film and the first insulating film located below the second insulating film are removed so that the first insulating film does not remain directly below a region in which the part of the second insulating film is removed.

4. The method according to claim 2, wherein:
   in the step of removing the part of the second insulating film, the part of the second insulating film and the first insulating film located below the second insulating film are removed so that the first insulating film does not remain directly below a region in which the part of the second insulating film is removed.

5. The method according to claim 1, wherein:
   in the step of removing the part of the second insulating film, the part of the second insulating film and the first insulating film located below the second insulating film are removed so that a part of the first insulating film remains directly below a region in which the part of the second insulating film is removed.

6. The method according to claim 2, wherein:
   in the step of removing the part of the second insulating film, the part of the second insulating film and the first insulating film located below the second insulating film are removed so that a part of the first insulating film remains directly below a region in which the part of the second insulating film is removed.

7. The method according to claim 1, wherein:
   a film thickness of the first insulating film is greater than a film thickness of the second insulating film.

8. The method according to claim 2, wherein:
a film thickness of the first insulating film is greater than a film thickness of the second insulating film.

9. The method according to claim 3, wherein:
a film thickness of the first insulating film is greater than a film thickness of the second insulating film.

10. The method according to claim 5, wherein:
a film thickness of the first insulating film is greater than a film thickness of the second insulating film.

11. The method according to claim 1, wherein:
the structure body further comprises:
an additional semiconductor structure body, and
a resin member disposed between the substrate and the semiconductor structure bodies and between the semiconductor structure bodies,
the second insulating film covers the first surface of each of the semiconductor structure bodies, the upper surface of the first insulating film of each of the semiconductor structure bodies, and an upper surface of the resin member,
in the step of removing the part of the second insulating film, at least a part of the upper surface of the resin member is exposed from the second insulating film, and
the step of removing the part of the second insulating film further includes removing the resin member from an upper surface side of the resin member exposed from the second insulating film.

12. The method according to claim 2, wherein:
the structure body further comprises:
an additional semiconductor structure body, and
a resin member disposed between the substrate and the semiconductor structure bodies and between the semiconductor structure bodies,
the second insulating film covers the first surface of each of the semiconductor structure bodies, the upper surface of the first insulating film of each of the semiconductor structure bodies, and an upper surface of the resin member,
in the step of removing the part of the second insulating film, at least a part of the upper surface of the resin member is exposed from the second insulating film, and
the step of removing the part of the second insulating film further includes removing the resin member from the upper surface side of the resin member exposed from the second insulating film.

13. The method according to claim 3, wherein:
the structure body further comprises:
an additional semiconductor structure body, and
a resin member disposed between the substrate and the semiconductor structure bodies and between the semiconductor structure bodies,
the second insulating film covers the first surface of each of the semiconductor structure bodies, the upper surface of the first insulating film of each of the semiconductor structure bodies, and an upper surface of the resin member,
in the step of removing the part of the second insulating film, at least a part of the upper surface of the resin member is exposed from the second insulating film, and
the step of removing the part of the second insulating film further includes removing the resin member from the upper surface side of the resin member exposed from the second insulating film.

14. The method according to claim 5, wherein:
the structure body further comprises:
an additional semiconductor structure body, and
a resin member disposed between the substrate and the semiconductor structure bodies and between the semiconductor structure bodies,
the second insulating film covers the first surface of each of the semiconductor structure bodies, the upper surface of the first insulating film of each of the semiconductor structure bodies, and an upper surface of the resin member,
in the step of removing the part of the second insulating film, at least a part of the upper surface of the resin member is exposed from the second insulating film, and
the step of removing the part of the second insulating film further includes removing the resin member from the upper surface side of the resin member exposed from the second insulating film.

15. The method according to claim 11, wherein:
the second insulating film is a silicon oxide film,
in the step of removing the part of the second insulating film, the second insulating film is etched by using gas containing fluorine, and
in the step of removing the resin member, the resin member is etched by using gas containing oxygen.

16. The method according to claim 12, wherein:
the second insulating film is a silicon oxide film,
in the step of removing the part of the second insulating film, the second insulating film is etched by using gas containing fluorine, and
in the step of removing the resin member, the resin member is etched by using gas containing oxygen.

17. The method according to claim 13, wherein:
the second insulating film is a silicon oxide film,
in the step of removing the part of the second insulating film, the second insulating film is etched by using gas containing fluorine, and
in the step of removing the resin member, the resin member is etched by using gas containing oxygen.

18. The method according to claim 14, wherein
the second insulating film is a silicon oxide film,
in the step of removing the part of the second insulating film, the second insulating film is etched by using gas containing fluorine, and
in the step of removing the resin member, the resin member is etched by using gas containing oxygen.

19. The method according to claim 15, wherein
the second insulating film is a silicon oxide film,
in the step of removing the part of the second insulating film, the second insulating film is etched by using gas containing fluorine, and
in the step of removing the resin member, the resin member is etched by using gas containing oxygen.

* * * * *